United States Patent
Motoyama

[11] Patent Number: 5,923,994
[45] Date of Patent: Jul. 13, 1999

[54] SELECTIVE OXIDATION PROCESS

[75] Inventor: Yoshikazu Motoyama, Miyazaki-ken, Japan

[73] Assignee: Oki Electric Co., Ltd., Tokyo, Japan

[21] Appl. No.: 09/019,591

[22] Filed: Feb. 6, 1998

[30] Foreign Application Priority Data

Apr. 7, 1997 [JP] Japan .................................. 9-088336

[51] Int. Cl.⁶ .................................................. H01L 21/76
[52] U.S. Cl. ............................ 438/439; 438/443; 438/452
[58] Field of Search ................................. 438/439, 452, 438/FOR 221, 229, 443; 148/DIG. 117

[56] References Cited

U.S. PATENT DOCUMENTS

| | | | |
|---|---|---|---|
| 4,968,641 | 11/1990 | Kalnitsky et al. | 438/439 |
| 5,128,274 | 7/1992 | Yabu et al. | 438/452 |
| 5,151,381 | 9/1992 | Liu et al. | 438/443 |
| 5,328,866 | 7/1994 | Chang et al. | 438/268 |
| 5,468,675 | 11/1995 | Kaigawa | 438/439 |
| 5,519,244 | 5/1996 | Yatsuda et al. | 257/372 |
| 5,567,645 | 10/1996 | Ahn et al. | 438/439 |

FOREIGN PATENT DOCUMENTS

| | | |
|---|---|---|
| 4-105346 | 4/1992 | Japan. |
| 6-342848 | 12/1994 | Japan. |

*Primary Examiner*—Peter Toby Brown
*Assistant Examiner*—Maria Guerrero
*Attorney, Agent, or Firm*—Jones, Volentine, Steinberg & Whitt, L.L.P.

[57] ABSTRACT

A selective oxidation process includes conducting a former phase of an oxidation process employing a thick mask layer to produce an oxide layer having a thickness less than the finished thickness of a desired semiconductor device isolation insulator. Then the thickness of the mask layer is reduced and a latter phase of the oxidation process using the reducing thickness mask layer is performed to produce the desired semiconductor device isolation insulator having the ultimate thickness. The use of both a thick mask layer and a reduced thickness mask layer for various phases of the oxidation process limits both the growth of the bird's beak and the growth of crystalline defects in the bird's beak.

21 Claims, 9 Drawing Sheets

5,923,994

SELECTIVE OXIDATION PROCESS

FIELD OF THE INVENTION

This invention relates to an improvement applicable to a selective oxidation process. More specifically, this invention relates to an improvement developed to suppress the growth of a bird's beak during a selective oxidation process, without being accompanied by growth of crystalline defects in the vicinity of an $SiO_2$ layer produced by the selective oxidation process.

BACKGROUND OF THE INVENTION AND PRIOR ART STATEMENT

A selective oxidation process is widely used in the semiconductor device industry for isolating individual semiconductor devices produced on a single semiconductor substrate. The selective oxidation process is based on an idea to employ a film of $Si_3N_4$ which scarcely allows O atoms to pass through, as an oxidation mask, includes "planox" developed by SGA of Italy, "LOCal Oxidation of Silicon (LOCOS)" developed by Philips of the Netherlands and "iso-planer" developed by Fair Child of the U.S.

In the wake of increasingly severe requirements to enhance the integration of an integrated circuit, an improvement applicable to the selective oxidation process was disclosed in one of the Japanese patent publication, Toku Kai Hei 4-105346 or JP-A-4-105346, in 1992.

Described below, referring to drawings, will be the improved technology which uses the $SiO_2$ layer which absorbs or relaxes stress caused by oxidation and a wall-shaped $Si_3N_4$ mask which suppresses horizontal growth of an $SiO_2$ layer ultimately for preventing a bird's beak from extending into an active area.

Referring to FIG. 1, a thermal oxidation process is conducted to produce an $SiO_2$ layer (601) having a thickness of several tens of nm on the top surface of a conductive Si substrate (600). The function of this $SiO_2$ layer (601) is to absorb or relax stress caused by oxidation of the Si substrate (600) or to prevent the stress from spreading toward under a mask employed for the oxidation. In this sense, the $SiO_2$ layer (601) is called a stress relaxing layer. A CVD process is conducted to produce an $SiO_2$ layer (602) having a thickness of several tens of through several hundreds of nm on top of the $SiO_2$ stress relaxing layer (601). The function of this $SiO_2$ layer (602) is to increase the height of the $Si_3N_4$ layer (603) to be produced in the next step, with respect to the top surface of the Si substrate (600). A CVD process is conducted to produce an $Si_3N_4$ layer (603) having a thickness of several tens through several hundreds of nm on top of the $SiO_2$ layer (602). A photo lithography process is conducted to remove the $SiO_2$ layer (602) from a field (or isolation) area or an area on which a thick $SiO_2$ layer (605) is scheduled to be produced in a following step for the ultimate purpose to isolate each of semiconductor elements produced on the Si substrate (600). An exemplary width and a thickness of the field area are respectively 1.2 through 1.5 μm and 300 through 400 nm. An impurity having a conductivity identical to that of the Si substrate (600) is implanted, in an area of the $SiO_2$ layer (602) corresponding to the field area for the ultimate purpose to produce a channel stopper layer (604) illustrated in FIG. 2.

Referring to FIG. 2, a thermal oxidation process is conducted, employing the patterned $Si_3N_4$ layer (603) as a mask. As a result, a thick $SiO_2$ layer (605) having a thickness of several hundred nm is produced in the field area. The thickness of the $SiO_2$ layer (605) is approximately a half of the ultimate thickness of the insulator layer of a field area. Incidentally, the impurity having a conductivity identical to that of the Si substrate (600) is moved downward to produce the channel stopper layer (604) under the thick $SiO_2$ layer (605).

Referring to FIG. 3, an anisotropic etching process is conducted to reduce the thickness of the $SiO_2$ layer (605) and to produce grooves along the edges of the $SiO_2$ layer (605). The groove turns out to surround the active areas. After an $Si_3N_4$ layer (606) is produced to cover the $SiO_2$ layer (605) and the $Si_3N_4$ layer (603), an anisotropic etching process is conducted to leave the $Si_3N_4$ layer (606) exclusively along the edges of the $SiO_2$ layer (605). The $Si_3N_4$ layer (606) remaining along the edges of the $SiO_2$ layer (605) has a shape of a wall which surrounds the active area.

Referring to FIG. 4, a thermal oxidation process is conducted again, employing the patterned $Si_3N_4$ layer (603) of which the edges are lined with the $Si_3N_4$ layer (606). As a result, the thickness of the $SiO_2$ layer (605) is inflated to 300 through 400 nm to produce an $SiO_2$ layer (607) forming a field area.

Since the edges of the $SiO_2$ layer (607) do not extend in the horizontal direction, due to the $Si_3N_4$ walls (606) arranged along the vertical edges of the piled layer of the $Si_3N_4$ layer (603), the $SiO_2$ layer (602) and the $SiO_2$ layer (601), the dimension of bird's beaks (608) turns out to be relatively small or in the range of several tens of nm.

The improved technology disclosed in the foregoing prior art, JP-A-4-105346, however, has drawbacks tabulated below.

1. In the improved technology, a wall-shaped $Si_3N_4$ mask (606) must be produced to line the vertical sides of the mask made of a piled layer of the $Si_3N_4$ layer (603), the $SiO_2$ layer (602) and the $SiO_2$ layer (601) to prevent horizontal growth of the $SiO_2$ layer (607) or of the bird's beak. Further, the $SiO_2$ layer (602) must be produced between the $SiO_2$ layer (601) and the $Si_3N_4$ layer (603) for the purpose of making the height of the wall-shaped $Si_3N_4$ mask (606) sufficiently large. Thus, the number of steps necessary for the foregoing improved technology is larger than that of the traditional selective oxidation process. In addition, since CVD processes which inherently require a long process time must be employed for some steps of the foregoing improved technology, the length of time required for the process is very long.
2. The oxidation processes to produce the $SiO_2$ layers (605) and (607) are inevitably accompanied by a phenomenon to gather $SiO_2$ molecules to produce grains thereof. During the etching process to remove the wall-shaped $Si_3N_4$ mask (606), the $SiO_2$ grains become dust, resultantly causing adverse results to make the yield or the throughput of the process less satisfactory.
3. Since the surface of the channel stopper layer (604) is covered by the wall-shaped $Si_3N_4$ mask (606) during the oxidation process, minute grooves (609) are made along the line separating the $SiO_2$ layer (607) from the channel stopper layer (604). Thus, the crystalline orientation of the surface becomes different for the channel stopper layer (604) from that of the Si substrate (600). Accordingly, the edges of the active areas can not be utilized for producing a semiconductor element. This resultantly reduces the integration of an IC to some extent.
4. Due to the foregoing minute grooves produced along the line separating the $SiO_2$ layer (607) from the channel stopper layer (604), a portion of a conductive Si layer which will be produced in a later step on the active area remains on the minute grooves during an etching process to be conducted in a later step. This remaining conductive Si layer causes various adverse results, e.g., a short circuit to bridge a source and a drain of an FET produced on the active area.

OBJECTS AND SUMMARY OF THE INVENTION

Accordingly, an object of this invention is to provide a selective oxidation process during which process the growth of a bird's beak is suppressed without being accompanied by any of the drawbacks, including a long and complicated steps, adverse results reducing yield or throughput of the process, reduction of integration of an IC produced by the process, and growth of crystalline defects produced in the vicinity of an $SiO_2$ layer which isolates semiconductor elements each other.

The other object of this invention is to provide a selective oxidation process employable for isolating a rectangular active area, the selective oxidation process being allowed to enjoy the advantages identical to those described above. Namely, the growth of a bird's beak is suppressed during the process without being accompanied by any of the drawbacks, including a long and complicated steps, adverse results reducing yield or throughput, reduction of integration of an IC produced by the process, and growth of crystalline defects produced in the vicinity of an $SiO_2$ layer which isolates semiconductor elements each other.

To achieve the foregoing object, a selective oxidation process in accordance with a first embodiment of this invention comprises:

a step for producing a stress relaxing layer on the top surface of a semiconductor substrate, a step for producing a selective oxidation mask layer on the top surface of the stress relaxing layer, a step for removing the selective oxidation mask layer from an area on which an ingredient semiconductor device isolation insulator layer is produced, for the purpose to produce a selective oxidation mask, a step for conducting an oxidation process to produce an oxide layer up to approximately a half of the ultimate thickness of an ingredient semiconductor device isolation insulator layer, a step for reducing the thickness of the selective oxidation mask, a step for conducting an oxidation process, employing the selective oxidation mask having a reduced thickness, to increase the thickness of the oxide layer up to the ultimate thickness of the ingredient semiconductor device isolation insulator layer, and a step for removing the selective oxidation mask and the stress relaxing layer.

In the foregoing process, the original thickness of the selective oxidation mask can be selected from a range of 300 through 375 nm and the reduced thickness of the selective oxidation mask can be selected from a range of 50 through 150 nm.

In the foregoing process, the original thickness of the selective oxidation mask can be 12 through 15 times as large as the thickness of the stress relaxing layer and the reduced thickness of the selective oxidation mask can be 5 through 10 times as large as the thickness of the stress relaxing layer.

In the foregoing process, the stress relaxing layer can be an $SiO_2$ layer and the selective oxidation mask layer can be an $Si_3N_4$ layer.

To achieve the foregoing other object, a selective oxidation process in accordance with a second embodiment of this invention comprises:

a step for producing a stress relaxing layer on the top surface of a semiconductor substrate, a step for producing a selective oxidation mask layer on the top surface of the stress relaxing layer, a step for removing the selective oxidation mask layer from an area on which an ingredient semiconductor device isolation layer is produced, for the purpose to produce a selective oxidation mask, a step for conducting an oxidation process to produce an oxide layer up to approximately a half of the ultimate thickness of an ingredient semiconductor device isolation insulator layer, a step for reducing the thickness of the selective oxidation mask excepting the area covering the longitudinal edges of the rectangular area on which an ingredient semiconductor device is produced, a step for conducting an oxidation process, employing the selective oxidation mask having a reduced thickness excepting the longitudinal edges of the rectangular area on which an ingredient semiconductor device is produced, to increase the thickness of the oxide layer up to the ultimate thickness of the ingredient semiconductor device isolation insulator layer, and a step for removing the selective oxidation mask and the stress relaxing layer.

In the foregoing process, the original thickness of the selective oxidation mask can be selected from a range of 300 through 375 nm and the reduced thickness of the selective oxidation mask layer can be selected from a range of 50 through 150 nm.

In the foregoing process, the original thickness of the selective oxidation mask can be 12 through 15 times as large as the thickness of the stress relaxing layer and the reduced thickness of the selective oxidation mask layer can be 5 through 10 times as large as the thickness of the stress relaxing layer.

In the foregoing process, the stress relaxing layer can be an $SiO_2$ layer and the selective oxidation mask layer can be an $Si_3N_4$ layer.

In the foregoing process, the area on which the thickness of the selective oxidation mask is remained unreduced can be a rectangular area extending from the line which defines the longitudinal edge of the rectangular area on which an ingredient semiconductor device is produced, by one $\mu m$ both in the longitudinal and transverse directions.

BRIEF DESCRIPTION OF THE DRAWINGS

This invention, together with its various features and advantages, can be readily understood from the following more detailed description presented in conjunction with the following drawings, in which.

DETAILED DESCRIPTION OF PREFERRED EMBODIMENTS

Referring to drawings, selective oxidation processes in accordance with two independent embodiments of this invention will be described below.

FIRST EMBODIMENT

Selective oxidation process having a step for conducting the former phase of an oxidation process for producing an isolation insulator layer, employing a thick $Si_3N_4$ selective oxidation mask produced on a stress relaxing $SiO_2$ layer to produce an $SiO_2$ layer having a thickness less than the finished thickness of the ingredient semiconductor device isolation insulator layer and having a less magnitude of bird's beak, followed by a step for conducting the latter phase of the oxidation process, after the thickness of the $Si_3N_4$ selective oxidation mask has been reduced to avoid growth of crystalline defects in the bird's beak.

In this embodiment, a field area on which an isolation insulator layer is produced or an field area (isolation area) surrounding an active area (square area) on which a semiconductor element is produced, is produced. The dimension of the active area on which a semiconductor element is produced is supposed to be 2 μm×2 μm. Exemplary width and thickness of the isolation area are 1.2 through 1.5 μm and 300 through 400 nm respectively.

Figure 5:
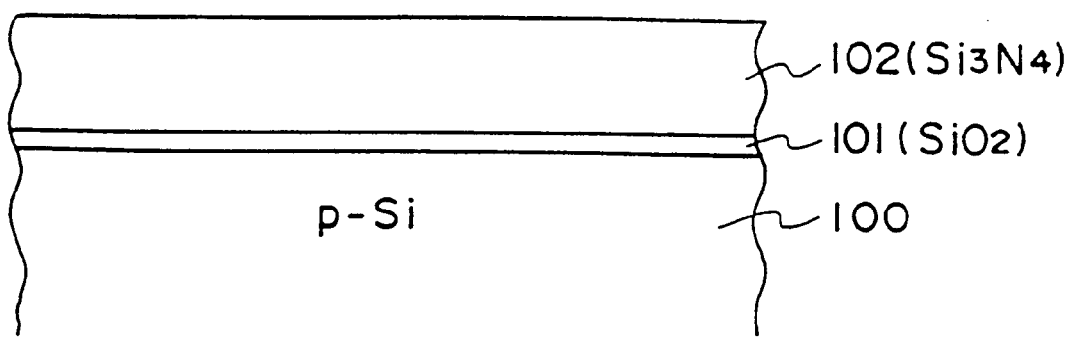
FIG. 5 is a schematic cross section of a part of a semiconductor substrate on which a selective oxidation process in accordance with the first embodiment of this invention is being applied.

Referring to FIG. 5, a thermal oxidation process is conducted to produce an $SiO_2$ layer (101) having an approximate thickness of 25 nm on an Si substrate (100) having one conductivity type (p type in this example) of the specific resistance in the range of 5 through 10 Ω cm. The function of the $SiO_2$ layer (101) is to absorb or relax stress caused by an oxidation process to be conducted later. In this sense, the $SiO_2$ layer (101) is called a stress relaxing layer. A CVD process is conducted to produce an $Si_3N_4$ layer (102) having a thickness range of 300 through 375 nm on the $SiO_2$ stress relaxing layer (101). This thickness range which is 12 through 15 times as large as the thickness of the $SiO_2$ stress relaxing layer (101) is much larger than that usually employed in the prior art. The reason why a thickness range of 300 through 375 nm is selected for the $Si_3N_4$ layer (102) is that a thick oxidation mask is effective to prevent a bird's beak from growing along the edge of an $SiO_2$ layer.

Figure 6:
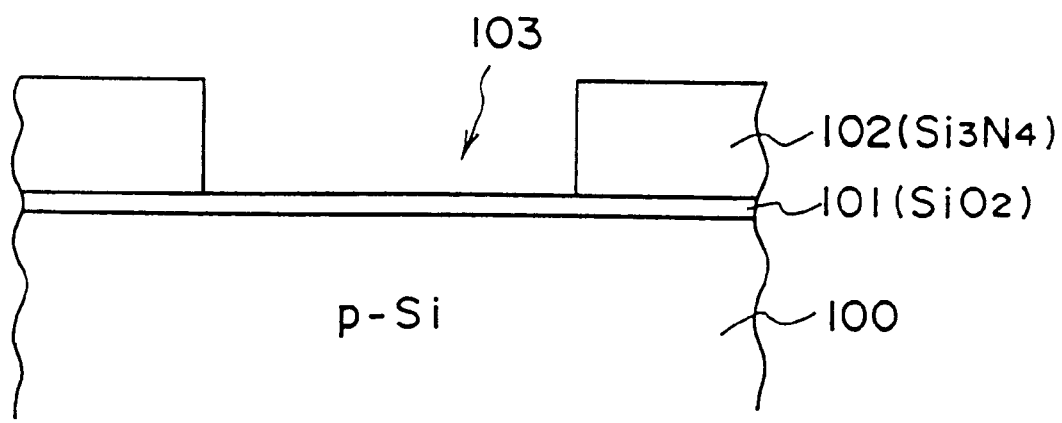
FIG. 6 is a schematic cross section of a part of a semiconductor substrate on which a selective oxidation process in accordance with the first embodiment of this invention is being applied.

Referring to FIG. 6, a photo lithography process is conducted to remove the $Si_3N_4$ layer (102) from the field area (103) on which an isolation insulator layer is produced. A dry etching process conducted by employing $SF_6$ can be employed for this process. The area (103) on which isolation insulator layer is produced is called the field area.

Figure 7:
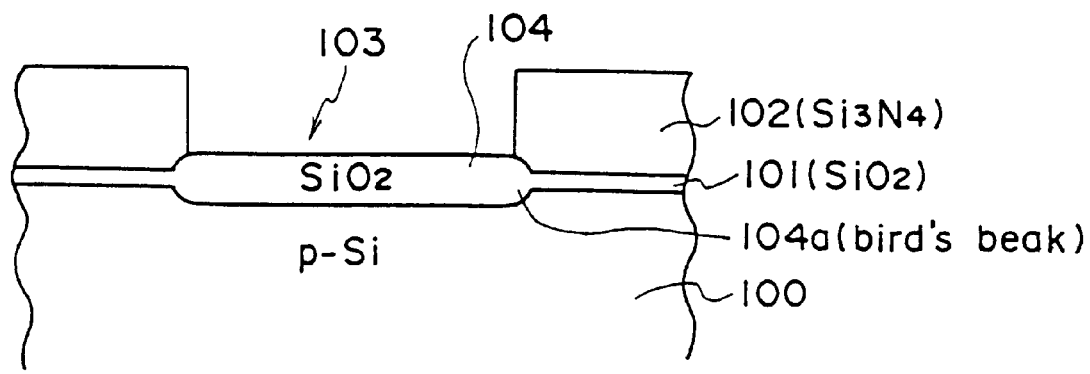
FIG. 7 is a schematic cross section of a part of a semiconductor substrate on which a selective oxidation process in accordance with the first embodiment of this invention is being applied.

Referring to FIG. 7, a wet oxidation process is conducted to increase the thickness of the $SiO_2$ layer (101) exposed in the field area is produced up to 50 through 150 nm. By this process, the $SiO_2$ layer (101) is converted to an $SiO_2$ layer (104). In this process, steam of 1,000° C. can be employed. In this process, the $Si_3N_4$ layer (102) acts as a selective oxidation mask. Since the thickness of the selective oxidation mask (102) is as thick as 300 through 375 nm, the length of a bird's beak is restricted to several tens of nm. This oxidation process is actually the former phase of a selective oxidation process which is conducted to produce an isolation insulator layer on the field area.

Figure 8:
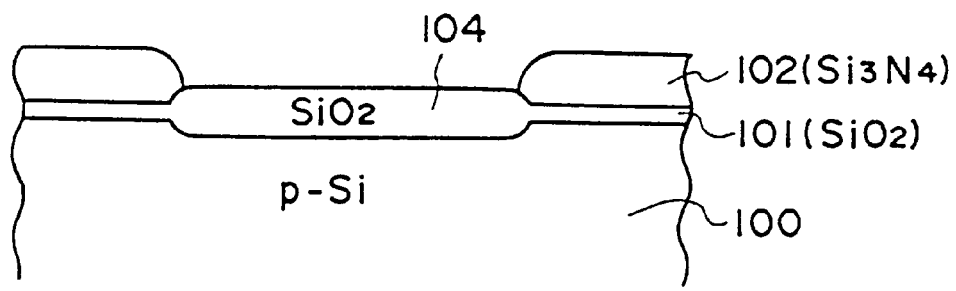
FIG. 8 is a schematic cross section of a part of a semiconductor substrate on which a selective oxidation process in accordance with the first embodiment of this invention is being applied.

Referring to FIG. 8, a dry etching process is conducted to reduce the thickness of the selective oxidation mask (102) down to 50 through 150 nm. A dry etching process conduced by employing $SF_6$ can be employed for this process, because this dry etching process has a high etching rate for $Si_3N_4$ and a small etching rate for $SiO_2$. This reduced thickness range (50 through 150 nm or 5 through 10 times as thick as the thickness of the stress relaxing $SiO_2$ film (101)) of the selective oxidation mask (102) is the thickness of a selective oxidation mask usually employed in the prior art.

The reason why the thickness of the selective oxidation mask (102) is reduced is to prevent crystalline defects from growing in the bird's beak during a selective oxidation process.

Referring again to FIG. 8, the foregoing former phase of the selective oxidation process causes the edge of the selective oxidation mask (102) to become round or thinner. This round shape of the edge of the selective oxidation mask (102) is effective to prevent stress from occurring in the bird's beak during the latter phase of the selective oxidation process to be conducted later.

Figure 9:
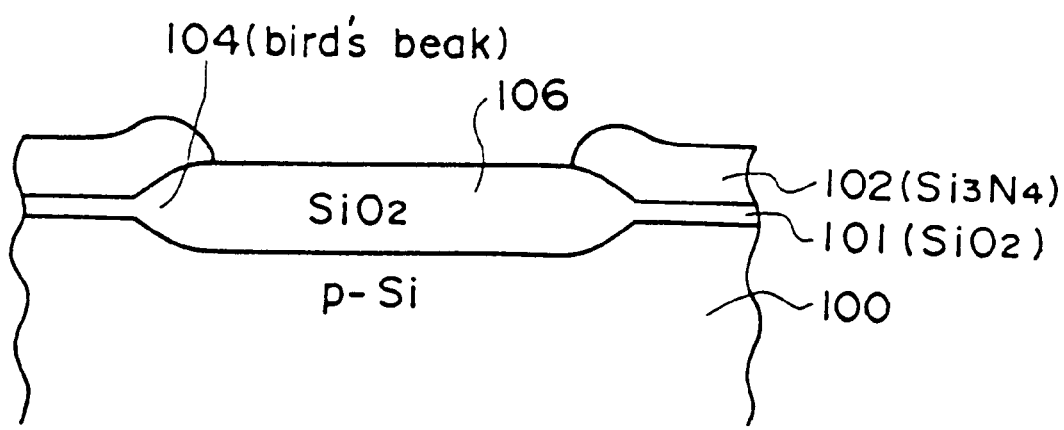
FIG. 9 is a schematic cross section of a part of a semiconductor substrate on which a selective oxidation process in accordance with the first embodiment of this invention is being applied.

Referring to FIG. 9, a wet oxidation process is conducted again to increase the thickness of the $SiO_2$ layer (104) up to the ultimate thickness range of the isolation insulator layer or the thickness range of 300 through 400 nm. Steam of 1,000° C. can be employed again for this process. The selective oxidation mask (102) having a reduced thickness is employed for this latter phase of the selective oxidation process. By this process, the $SiO_2$ layer (104) is converted to an $SiO_2$ layer (106). Since the thickness of the selective oxidation mask (102) was reduced to a range of 50 through 150 nm, a bird's beak (104a) grows to some extent. Since the selective oxidation process is divided into two, including a former phase which is conducted with a thick selective oxidation mask (102) and a latter phase which is conducted with a selective oxidation mask (102) having an ordinary thickness, however, the length of the bird's beak (104a) is restricted to a range of 50 through 100 nm, which is much less than that of the prior art. Incidentally, since the latter phase of the selective oxidation process is conducted with a selective oxidation mask (102) having a thickness range of 50 through 150 nm, crystalline defects are not produced in the bird's beak (104a) to a significant extent.

Figure 10:
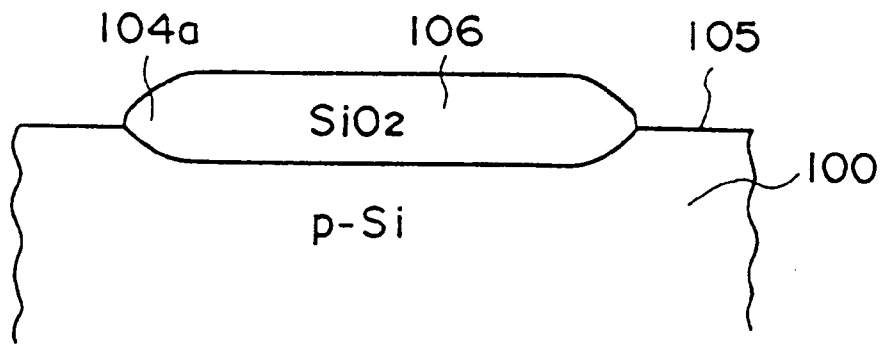
FIG. 10 is a schematic cross section of a part of a semiconductor substrate on which a selective oxidation process in accordance with the first embodiment of this invention has been applied.

Referring to FIG. 10, a wet etching process conducted by employing hot $H_3PO_4$ is conducted to remove the selective oxidation mask (102) and a wet etching process conducted by employing HF is conducted to remove the stress relaxing $SiO_2$ film (101), to finally expose an area (105) on which semiconductor elements are produced.

In this manner, an area at which semiconductor elements are isolated from one another is produced without being accompanied by significant growth of a bird's beak and of a crystalline defect. Since the growth of a bird's beak is remarkably suppressed, the dimension of the area on which semiconductor element is produced has been increased by 15 through 30%, in the case where the dimension of the area on which semiconductor element is produced is 2 $\mu$m×2 $\mu$m. This resultantly enhances the integration of an IC produced employing an Si substrate for which isolation areas were produced employing a selective oxidation process in accordance with this embodiment of this invention.

Figure 1:
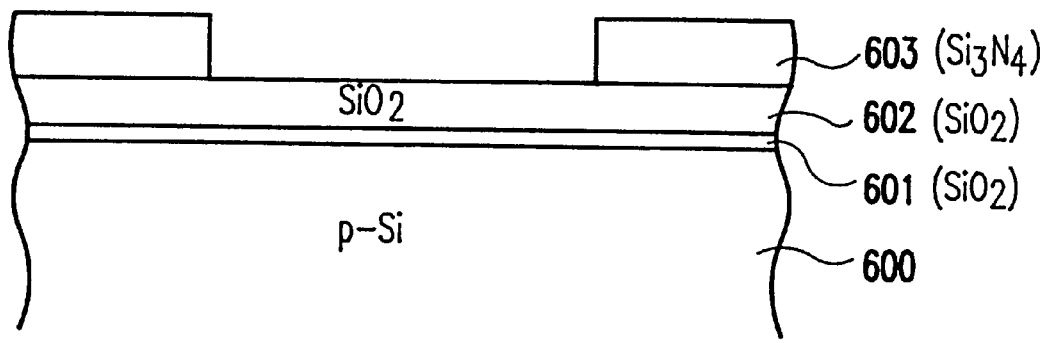
FIG. 1 is a schematic cross section of a part of a semiconductor substrate on which a selective oxidation process available in the prior art is being applied.
Figure 2:
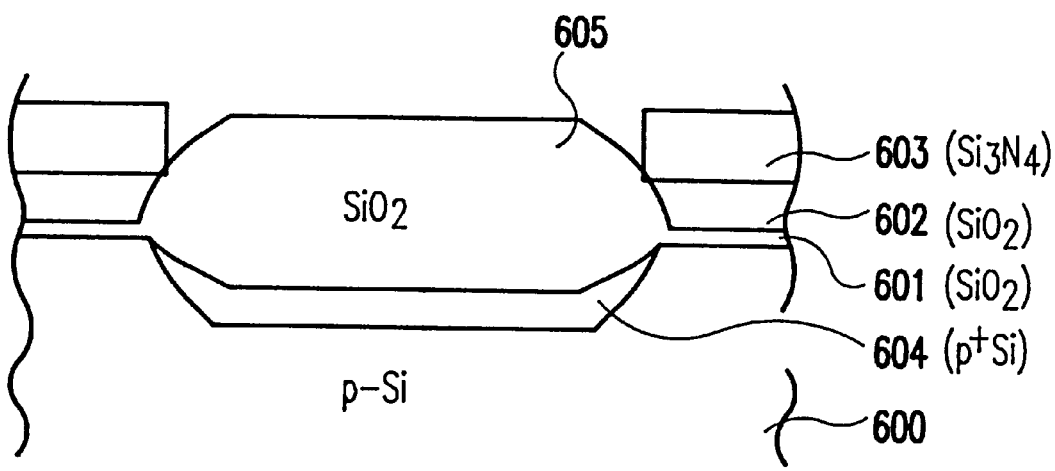
FIG. 2 is a schematic cross section of a part of a semiconductor substrate on which a selective oxidation process available in the prior art is being applied.
Figure 3:
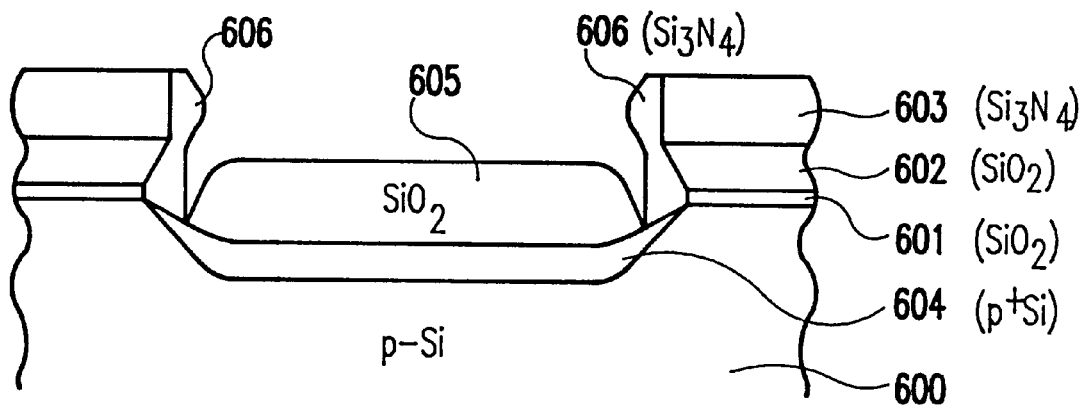
FIG. 3 is a schematic cross section of a part of a semiconductor substrate on which a selective oxidation process available in the prior art is being applied.
Figure 4:
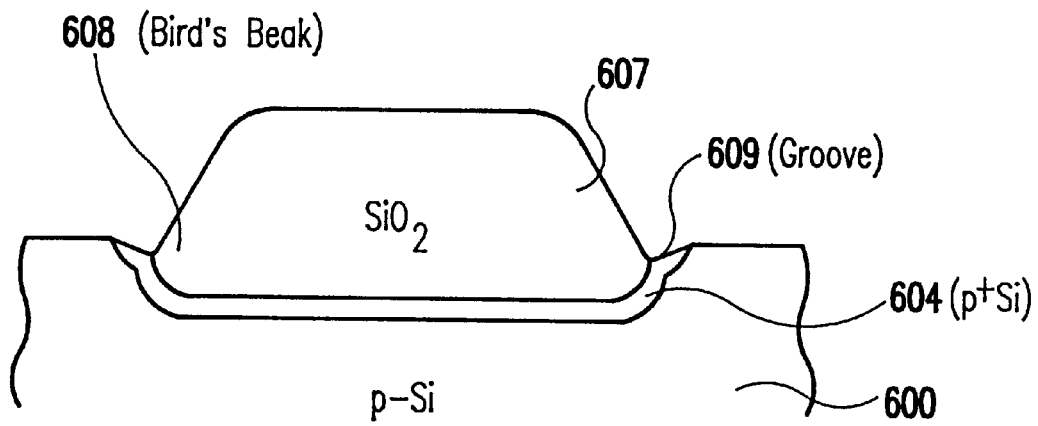
FIG. 4 is a schematic cross section of a part of a semiconductor substrate on which a selective oxidation process available in the prior art has been applied.

In comparison with the prior art referred to above, the process time and the production cost are sizable reduced, because the side wall (606) and the $SiO_2$ layer (602) illustrated in FIG. 1 need not be produced. In view of the fact that CVD processes are required for producing the side wall (606) and the $SiO_2$ layer (602), elimination of such layers causes a sizable reduction in the process time. Elimination of the $SiO_2$ layer (602) results in elimination of the problem in which $SiO_2$ is grained and the $SiO_2$ grains become dust to make the throughput less. Further, elimination of the side wall (606) results in elimination of the problem in which the minute grooves (609) are produced. As a result, the problem of a short circuit to bridge a source and a drain of an FET produced on the semiconductor substrate can readily be avoided.

SECOND EMBODIMENT

Selective oxidation process employable for isolating a rectangular area on which semiconductor element is produced, the selective oxidation process having a step for conducting the former phase of an oxidation process for producing an isolation insulator layer, employing a thick $Si_3N_4$ selective oxidation mask produced on a stress relaxing $SiO_2$ layer to produce an $SiO_2$ layer having a thickness less than the finished thickness of an isolation insulator layer and having a less magnitude of a bird's beak, followed by a step for conducting the latter phase of the oxidation process, after the thickness of the $Si_3N_4$ selective oxidation mask has been reduced excepting the longitudinal edges of the rectangular area on which a semiconductor element is produced, for the purpose to avoid growth of crystalline defects in the transverse edges of the bird's beak.

In this embodiment, the dimension of the rectangular area on which a semiconductor element is produced to be surrounded by an isolation area which is produced by the process in accordance with this embodiment is supposed to be 1 $\mu$m×5 $\mu$m. Exemplary width and thickness of the isolation area are 1.2 through 1.5 $\mu$m and 300 through 400 nm respectively.

Figure 11:
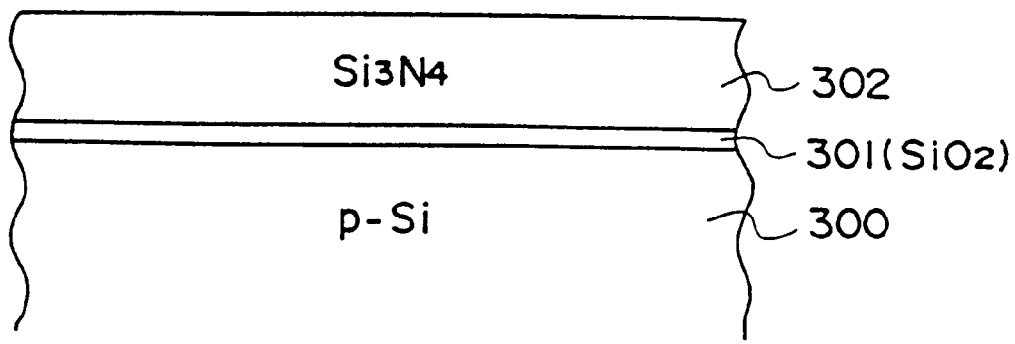
FIG. 11 is a schematic cross section of a part of a semiconductor substrate on which a selective oxidation process in accordance with the second embodiment of this invention is being applied.

Referring to FIG. 11, a thermal oxidation process is conducted to produce a stress relaxing $SiO_2$ layer (301) having an approximate thickness of 25 nm on an Si substrate (300) having one conductivity type (p type in this example) of the specific resistance in the range of 5 through 10 Ω cm. A CVD process is conducted to produce an $Si_3N_4$ layer (302) having a thickness range of 300 through 375 nm on the $SiO_2$ stress relaxing layer (301). This thickness range which is 12 through 15 times as large as the thickness of the $SiO_2$ stress relaxing layer (301) is large enough to prevent a bird's beak from growing along the edge of an isolation insulator layer.

Figure 12:
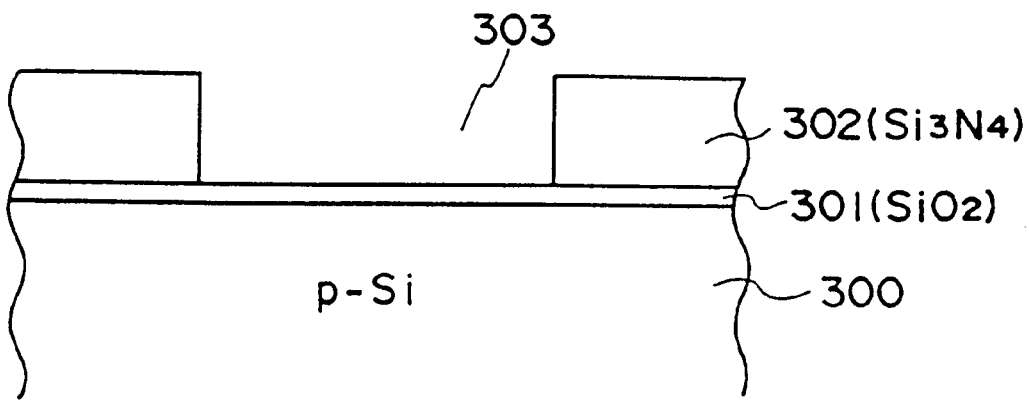
FIG. 12 is a schematic cross section of a part of a semiconductor substrate on which a selective oxidation process in accordance with the second embodiment of this invention is being applied.

Referring to FIG. 12, a photo lithography process is conducted to remove the $Si_3N_4$ layer (302) from the field area (303) on which an isolation insulator layer is produced. A dry etching process conducted by employing $SF_6$ can be employed for this process.

Figure 13:
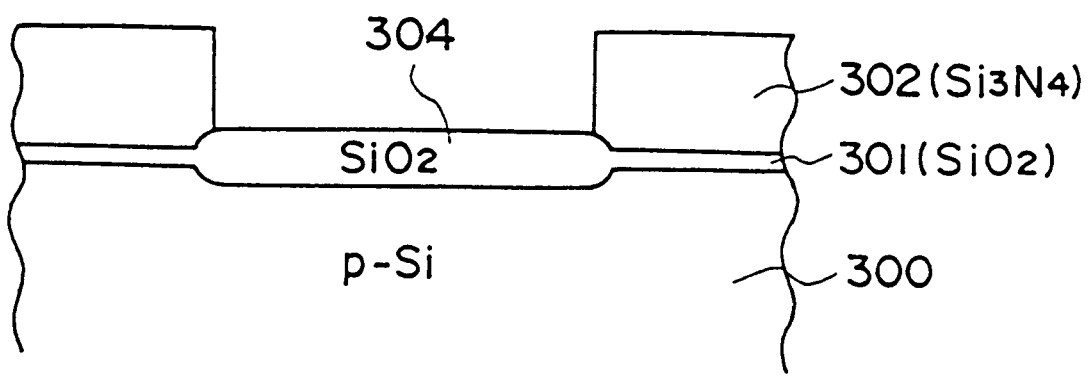
FIG. 13 is a schematic cross section of a part of a semiconductor substrate on which a selective oxidation process in accordance with the second embodiment of this invention is being applied.

Referring to FIG. 13, a wet oxidation process is conducted to increase the thickness of the $SiO_2$ layer (301) exposed in the field area is produced up to 50 through 150 nm. By this process, the $SiO_2$ layer (301) is converted to an $SiO_2$ layer (304). In this process, steam of 1,000° C. can be employed. In this process, the $Si_3N_4$ layer (302) acts as a selective oxidation mask. Since the thickness of the selective oxidation mask (302) is as thick as 300 through 375 nm, the length of a bird's beak is restricted to several tens of nm. This oxidation process is actually the former phase of a selective oxidation process which is conducted to produce an isolation insulator layer on the field area.

Figure 14:
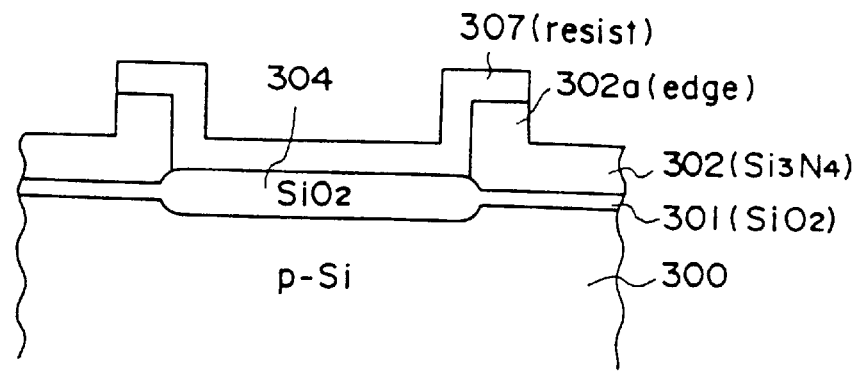
FIG. 14 is a schematic cross section of a part of a semiconductor substrate on which a selective oxidation process in accordance with the second embodiment of this invention is being applied.
Figure 15:
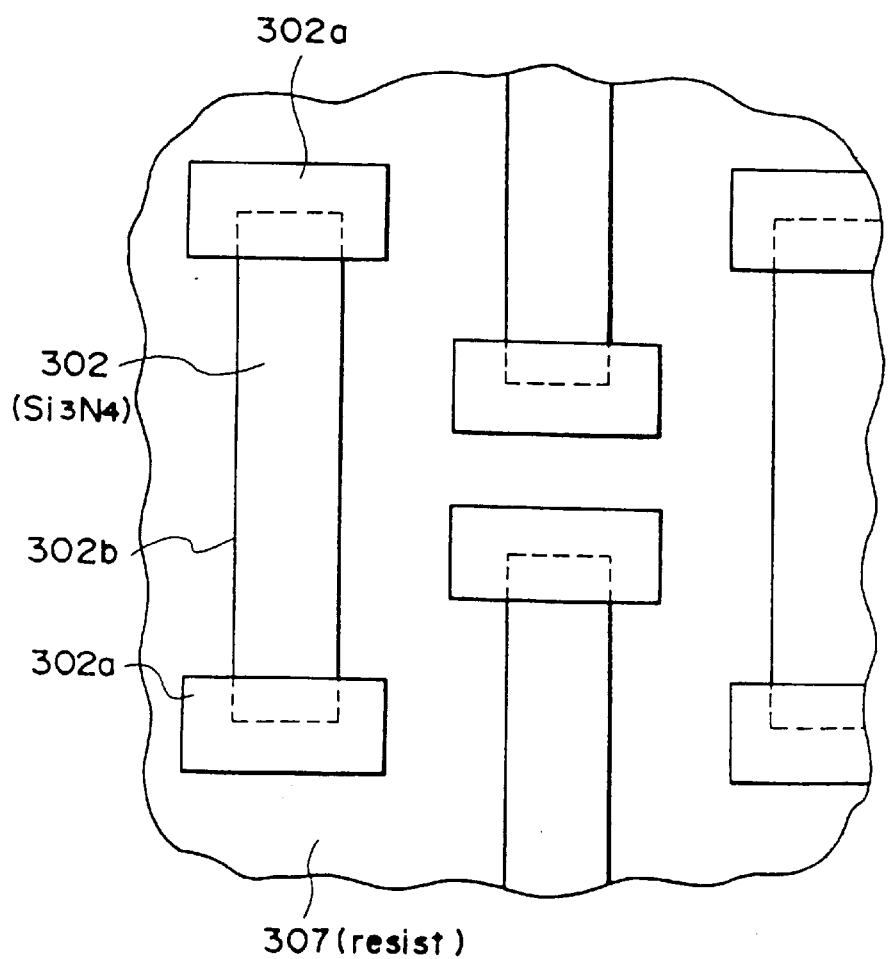
FIG. 15 is a plan view of a part of a semiconductor substrate on which a selective oxidation process in accordance with the second embodiment of this invention is being applied.

Referring to FIGS. 14 and 15, a photo resist is spin coated on the Si substrate (300) to produce a photo resist layer (307). After the photo resist layer (307) is exposed, employing a photo mask which covers the area on which an isolation layer is produced and the both edges thereof at the longitudinal ends (302a) or a photo mask which is reverse to the above, the exposed photo resist layer (307) is developed to be remained on the area on which an isolation layer is produced and the both edges thereof at the longitudinal ends (302a). In FIG. 15, the dimension of the field area (302) is supposed to be 1 $\mu$m×5 $\mu$m, and the field area on which an ingredient semiconductor device is produced (302) is supposed to be arranged in a zigzag pattern, remaining a space of 1.2 through 1.5 $\mu$m in the longitudinal and transverse directions. The dimension of the edge area (302a) on which the thickness of the $Si_3N_4$ selective oxidation mask (302) is remained thick is supposed to be 1 $\mu$m in the longitudinal direction and 2 $\mu$m in the transverse direction. The label (302b) indicates the transverse edge of the field area (302). The label (307) indicates the area covered by the photo resist layer (307). Employing the remained photo resist layer (307) which covers the isolation area (the area on which a semiconductor element is not produced) and the longitudinal edges (302a) of the active area (302), as an etching mask, a dry etching process employing $SF_6$ is conducted to reduce the thickness of the $Si_3N_4$ selective oxidation mask (302) excepting the longitudinal edges (302a) of the active area.

Figure 16:
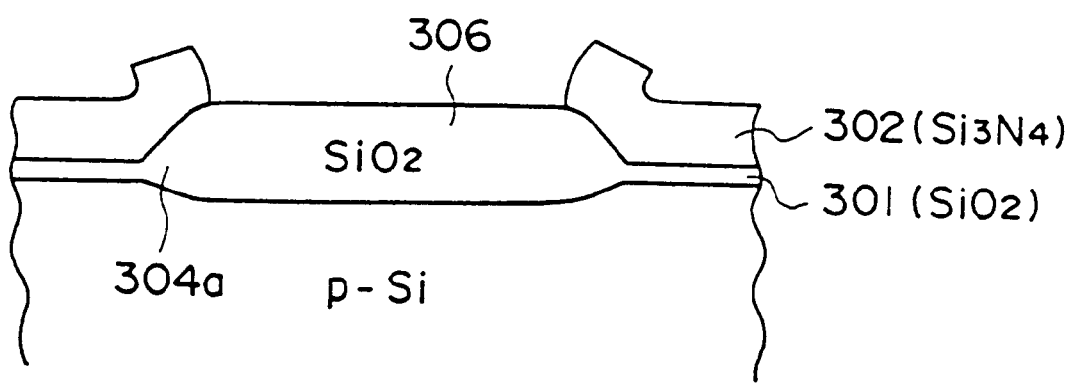
FIG. 16 is a schematic cross section of a part of a semiconductor substrate on which a selective oxidation process in accordance with the second embodiment of this invention is being applied.
Figure 17:
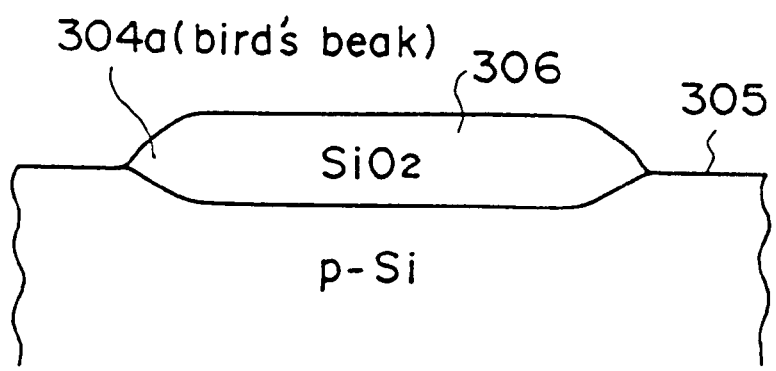
FIG. 17 is a schematic cross section of a part of a semiconductor substrate on which a selective oxidation process in accordance with the second embodiment of this invention has been applied.

Referring to FIG. 16, after the photo resist layer (307) employed as an etching mask in the foregoing process, is removed, a wet oxidation process is conducted again to increase the thickness of the $SiO_2$ layer (304) up to the ultimate thickness range of the isolation insulator or the thickness range of 300 through 400 nm. Steam of 1,000° C. can be employed again for this process. The selective oxidation mask (302) having a reduced thickness excepting for the area corresponding to the longitudinal edges (302a) of the active area, is employed for this latter phase of the selective oxidation process. By this process, the $SiO_2$ layer (304) is converted to an $SiO_2$ layer (306). Since the thickness of the $Si_3N_4$ selective oxidation mask (302) is 300 through 375 nm at the longitudinal ends (302a) of the active area, the bird's beaks are prevented from extending in the longitudinal direction of the active area. Incidentally, since the thickness of the $Si_3N_4$ selective oxidation mask (302) is 50 through 150 nm along the transverse edges (302b) of the active area, crystalline defects are prevented from growing along the transverse edges (302b) of the active area.

The reason why the thickness of the $Si_3N_4$ selective oxidation mask (302) which is employed for the latter phase of the selective oxidation process is made thick exclusively at the longitudinal ends and thin exclusively along the transverse edges is that a bird's beak is inclined to extend exclusively to the longitudinal direction, while crystalline defects are inclined to grow exclusively along the transverse edges, and vice versa. In other words, in the case where an area on which a semiconductor element is produced is a rectangle, a bird's beak can be prevented from extending in the longitudinal directions and crystalline defects can be prevented from growing in the transverse directions, provided a thick selective oxidation mask is employed at the longitudinal edges and a thin selective oxidation mask is employed in the transverse directions.

Since crystalline defects are inclined not to grow in the longitudinal direction, a thick selective oxidation mask employed at the longitudinal edges does not cause growth of crystalline defects in the longitudinal directions.

Referring again to FIG. 16, a wet etching process conducted by employing hot $H_3PO_4$ is conducted to remove the selective oxidation mask (302) and a wet etching process conducted by employing HF is conducted to remove the stress relaxing $SiO_2$ film (301), to finally expose an area (305) on which semiconductor elements are produced.

In this manner, an area at which ingredient semiconductor elements are isolated from one another is produced without being accompanied by significant growth of bird's beaks and crystalline defects both in the longitudinal and transverse directions. Since the growth of a bird's beak is remarkably suppressed, the dimension of the area on which a semiconductor element is produced has been increased by 5 through 10%, in the case where the dimension of the area on which a semiconductor element is produced is 1×5 μm. This resultantly enhances the integration of an IC produced employing an Si substrate for which isolation areas were produced employing a selective oxidation process in accordance with this embodiment of this invention.

It is noted that the magnitude of the extension of bird's beaks and of growth of crystalline defects is made uniform for both the longitudinal and transverse directions, despite the area on which a semiconductor element is produced is a rectangle.

Similarly to the first embodiment, the process time and the production cost are sizably reduced with respect to the prior art referred to above, because the side wall (606) and the $SiO_2$ layer (602) illustrated in FIG. 1 need not be produced. In view of the fact that CVD processes are required for producing the side wall (606) and the $SiO_2$ layer (602), elimination of such layers causes a sizable reduction in the process time. Elimination of the $SiO_2$ layer (602) results in elimination of the problem in which $SiO_2$ is grained and the $SiO_2$ grains become dust to make the throughput less. Further, elimination of the side wall (606) results in elimination of the problem in which the minute grooves (609) are produced. As a result, the problem of a short circuit to bridge a source and a drain of an FET produced on the semiconductor substrate can readily be avoided.

The foregoing description has clarified that this invention has successfully provided two independent selective oxidation processes during which processes the growth of a bird's beak is suppressed without being accompanied by any of the drawbacks, including a long and complicated steps, adverse results reducing yield or throughput of the process, reduction of integration of an IC produced employing a Si wafer for which the selective oxidation process of this invention was applied, and growth of crystalline defects produced in the vicinity of an $SiO_2$ layer which isolates semiconductor elements each other.

Although this invention has been described with reference to specific embodiments, this description is not meant to be construed in a limiting sense. It is therefore contemplated that the appended claims will cover any such modifications or embodiments as fall within the true scope of this invention.

What is claimed is:

1. A selective oxidation process comprising:
   producing a stress relaxing layer on the top surface of a semiconductor substrate;
   producing a selective oxidation mask layer on the top surface of said stress relaxing layer;
   producing a selective oxidation mask by removing said selective oxidation mask layer from an area on which an insulating layer is to be produced;
   conducting an oxidation process, employing said selective oxidation mask, to produce a portion of an insulating layer;
   reducing the thickness of said selective oxidation mask,
   conducting an oxidation process, employing said selective oxidation mask having a reduced thickness, to increase the thickness of said portion of an insulating layer to the ultimate thickness of a desired semiconductor device isolation insulator layer; and
   removing said selective oxidation mask layer and said stress relaxing layer.

2. A selective oxidation process in accordance with claim 1, wherein the original thickness of said selective oxidation mask is 300 through 375 nm and the reduced thickness of said selective oxidation mask is 50 through 150 nm.

3. A selective oxidation process in accordance with claim 1, wherein the original thickness of said selective oxidation mask is 12 through 15 times as large as the thickness of said stress relaxing layer and the reduced thickness of said selective oxidation mask is 5 through 10 times as large as the thickness of said stress relaxing layer.

4. A selective oxidation process in accordance with claim 1, wherein said stress relaxing layer is an $SiO_2$ layer and said selective oxidation mask layer is an $Si_3N_4$ layer.

5. A selective oxidation process in accordance with claim 1, wherein said portion is half of an insulating layer.

6. A selective oxidation process in accordance with claim 1, wherein said reducing of said selective oxidation mask includes using a process having a higher removal rate for said selective oxidation layer than for said insulating layer.

7. A selective oxidation process for isolating a rectangular area on which a semiconductor element is produced comprising:

producing a stress relaxing layer on the top surface of a semiconductor substrate;

producing a selective oxidation mask layer on the top surface of said stress relaxing layer;

producing a selective oxidation mask by removing said selective oxidation mask layer from an area on which an isolating layer is to be produced;

conducting an oxidation process, employing said selective oxidation mask, to produce a portion of an isolating layer;

reducing the thickness of said selective oxidation mask except in the area covering longitudinal edges of said rectangular area on which a semiconductor element is produced;

conducting an oxidation process, employing said selective oxidation mask having a reduced thickness, except in the longitudinal edges of the rectangular area on which a semiconductor element is produced, to increase the thickness of said portion of an isolating layer to the ultimate thickness of an isolating layer; and removing said selective oxidation mask layer and said stress relaxing layer.

8. A selective oxidation process for isolating a rectangular area on which a semiconductor element is produced in accordance with claim 7, wherein the original thickness of said selective oxidation mask is 300 through 375 nm and the reduced thickness of said selective oxidation mask is 50 through 150 nm.

9. A selective oxidation process for isolating a rectangular area on which a semiconductor element is produced in accordance with claim 7, the original thickness of said selective oxidation mask is 12 through 15 times as large as the thickness of said stress relaxing layer and reduced thickness of said selective oxidation mask is 5 through 10 times as large as the thickness of said stress relaxing layer.

10. A selective oxidation process for isolating a rectangular area on which a semiconductor element is produced in accordance with claim 7, wherein said stress relaxing layer is an $SiO_2$ layer and said selective oxidation mask layer is an $Si_3N_4$ layer.

11. A selective oxidation process for isolating a rectangular area on which a semiconductor element is produced in accordance with claim 7, wherein the area on which the thickness of said selective oxidation mask remains unreduced is a rectangular area extending from the line defining the longitudinal edge of the rectangular area on which a semiconductor element is produced, by one $\mu$m both in the longitudinal and transverse directions.

12. A selective oxidation process in accordance with claim 7, wherein said portion is half of an isolating layer.

13. A selective oxidation process in accordance with claim 7, wherein said reducing of said selective oxidation mask includes using a process having a higher removal rate for said selective oxidation layer than for said isolating layer.

14. A selective oxidation process comprising:

providing a semiconductor substrate having an active region and an isolation region thereon;

producing a selective oxidation mask layer on the active region;

oxidizing said isolation region to form a oxidation layer using said mask layer;

reducing the thickness of said mask layer;

oxidizing said oxidation layer for increasing the thickness of said oxidation layer using said mask layer having a reduced thickness; and removing said mask layer.

15. A selective oxidation process in accordance with claim 14, wherein the original thickness of said mask layer is 300 through 375 nm and the reduced thickness of said mask layer is 50 through 150 nm.

16. A selective oxidation process in accordance with claim 14, wherein said mask layer is an $Si_3N_4$ layer.

17. A selective oxidation process in accordance with claim 14, wherein said reducing of said selective oxidation mask includes using a process having a higher removal rate for said selective oxidation layer than for said oxidation layer.

18. A selective oxidation process comprising:

providing a semiconductor substrate having an active region and an isolation region thereon, the active region being formed in a substantially rectangular shape;

producing a selective oxidation mask layer on the active region;

oxidizing said isolation region to form an oxidation layer using said mask layer;

reducing the thickness of said mask layer except in the area covering longitudinal edges of said active region;

oxidizing said oxidation layer for increasing the thickness of said oxidation layer using said mask layer having a reduced thickness; and removing said mask layer.

19. A selective oxidation process in accordance with claim 18, wherein the original thickness of said mask layer is 300 through 375 nm and the reduced thickness of said mask layer is 50 through 150 nm.

20. A selective oxidation process in accordance with claim 18, wherein said mask layer is an $Si_3N_4$ layer.

21. A selective oxidation process in accordance with claim 18, wherein said reducing of said selective oxidation mask includes using a process having a higher removal rate for said selective oxidation layer than for said oxidation layer.

* * * * *